US00RE36311E

United States Patent [19]

Frisina et al.

[11] E Patent Number: Re. 36,311

[45] Reissued Date of Patent: Sep. 21, 1999

[54] INTEGRATED HIGH-VOLTAGE BIPOLAR POWER TRANSISTOR AND LOW VOLTAGE MOS POWER TRANSISTOR STRUCTURE IN THE EMITTER SWITCHING CONFIGURATION AND RELATIVE MANUFACTURING PROCESS

[75] Inventors: Ferruccio Frisina; Giuseppe Ferla, both of Catania, Italy

[73] Assignee: SGS-Thomson Microelectronics, S.r.l., Agrate Brianza, Italy

[21] Appl. No.: 08/253,151

[22] Filed: Jun. 2, 1994

Related U.S. Patent Documents

Reissue of:

[64] Patent No.: 5,118,635
Issued: Jun. 2, 1992
Appl. No.: 07/749,251
Filed: Aug. 23, 1991 U.S. Applications:

[62] Division of application No. 07/288,405, Dec. 21, 1988, Pat. No. 5,065,213.

[30] Foreign Application Priority Data

Dec. 28, 1987 [IT] Italy ..... 6631/87

[51] Int. Cl.[6] ..... H01L 21/265; H01L 21/70; H01L 27/00

[52] U.S. Cl. ..... 437/31; 437/6; 437/54; 437/59

[58] Field of Search ..... 437/32, 31, 59, 437/33, 55, 74, 75, 77, 34, 45, 54, 6; 148/DIG. 85, DIG. 37; 257/566, 502, 549, 328, 370, 262, 378

[56] References Cited

U.S. PATENT DOCUMENTS

T892,019 11/1971 Sack ..... 257/502

3,544,863 12/1970 Price et al. ..... 148/DIG. 37

(List continued on next page.)

FOREIGN PATENT DOCUMENTS 322 040 12/1988 European Pat. Off. .
322 041 12/1988 European Pat. Off. .
347 550 4/1989 European Pat. Off. .

OTHER PUBLICATIONS

Blanchard, "A Power Transistor With an Integrated Thermal Feedback Mechanism," Master of Science Dissertation (1970).

*Primary Examiner*—John Niebling
*Assistant Examiner*—Brian K. Dutton
*Attorney, Agent, or Firm*—Betty Formby; Robert Groover

[57] ABSTRACT

A description is given of two versions of an integrated structure in the emitter switching configuration comprising a high-voltage bipolar power transistor and a low-voltage MOS power transistor. In the vertical MOS version, the emitter region of the bipolar transistor is completely buried, partly in a first N− epitaxial layer and partly in a second N− epitaxial layer; the MOS is located above the emitter region. The bipolar is thus a completely buried active structure. In the horizontal MOS version, in a N− epitaxial layer there are two P+ regions, the first, which constitutes the base of the bipolar transistor, receives the N+ emitter region of the same transistor; the second receives two N+ regions which constitute the MOS source and drain regions, respectively; the front of the chip is provided with metal plating to ensure the connection between the MOS drain and the bipolar emitter contacts.

25 Claims, 4 Drawing Sheets

U.S. PATENT DOCUMENTS

| | | | |
|---|---|---|---|
| 3,580,745 | 5/1971 | Kooi . | |
| 3,880,676 | 4/1975 | Douglas et al. | 437/31 |
| 4,032,956 | 6/1977 | Yagi et al. | 257/378 |
| 4,120,707 | 10/1978 | Beasom | 257/556 |
| 4,151,006 | 4/1979 | De Graaff et al. | 148/1.5 |
| 4,210,925 | 7/1980 | Morcom et al. | 357/46 |
| 4,239,558 | 12/1980 | Morishita et al. | 148/175 |
| 4,277,794 | 7/1981 | Nuzillat | 257/549 |
| 4,311,532 | 1/1982 | Taylor | 148/1.5 |
| 4,315,781 | 2/1982 | Henderson | 437/45 |
| 4,344,081 | 8/1982 | Pao et al. | 357/43 |
| 4,425,516 | 1/1984 | Wanlass | 307/446 |
| 4,458,408 | 7/1984 | Alonas et al. | 437/6 |
| 4,483,738 | 11/1984 | Blossfeld | 437/31 |
| 4,523,215 | 6/1985 | Iwatani | 257/549 |
| 4,667,393 | 5/1987 | Ferla et al. | 437/31 |
| 4,721,684 | 1/1988 | Musumeci | 437/31 |
| 4,780,430 | 10/1988 | Musumeci et al. | 437/31 |
| 4,814,288 | 3/1989 | Kimura et al. | 437/31 |
| 4,879,584 | 11/1989 | Takagi et al. | 257/502 |
| 4,881,119 | 11/1989 | Paxman et al. | 357/43 |
| 4,892,836 | 1/1990 | Andreini et al. | 437/59 |
| 4,898,836 | 2/1990 | Zambrano et al. | 437/31 |
| 4,935,799 | 6/1990 | Mori et al. | 357/43 |
| 4,947,231 | 8/1990 | Palara et al. | 257/549 |
| 4,969,030 | 11/1990 | Musumeci et al. | 257/249 |
| 5,065,213 | 11/1991 | Frisina et al. . | |
| 5,118,635 | 6/1992 | Frisina et al. . | |
| 5,119,161 | 6/1992 | Zambrano et al. . | |

INTEGRATED HIGH-VOLTAGE BIPOLAR POWER TRANSISTOR AND LOW VOLTAGE MOS POWER TRANSISTOR STRUCTURE IN THE EMITTER SWITCHING CONFIGURATION AND RELATIVE MANUFACTURING PROCESS

Matter enclosed in heavy brackets [ ] appears in the original patent but forms no part of this reissue specification; matter printed in italics indicates the additions made by reissue.

This is a divisional of co-pending application Ser. No. 07/288,405 filed on Dec. 21, 1988, now U.S. Pat. No. 5,065,213.

FIELD OF THE INVENTION

This invention relates to an integrated high-voltage bipolar power transistor and low-voltage MOS power transistor structure in an emitter switching configuration and to a manufacturing process therefore.

BACKGROUND OF THE INVENTION

Emitter switching is a circuit configuration in which a low-voltage power transistor (typically an MOS transistor) cuts off the emitter current of a high-voltage power transistor (typically a bipolar transistor) in order to switch it off. This configuration, which up until now was obtained by means of discrete components, offers the following advantages:

it increases the strength of bipolar transistor as far as the possibility of inverted secondary ruptures (ESB) occurring are concerned;

it combines the current and voltage carrying capacity of a piloted transistor and the high speed of a low-voltage transistor;

it enables the system to be piloted directly with linear logic circuits, through the MOS gate.

OBJECT OF THE INVENTION

In view of the advantages that an integrated circuit generally offers, as compared to an analog circuit obtained by means of discrete components, the object of this invention is to provide a high-voltage bipolar power transistor and a low-voltage MOS power transistor, connected together in the emitter switching configuration, and integrated in a single chip of semiconductor material.

SUMMARY OF THE INVENTION

The integrated high-voltage bipolar power transistor and vertical low-voltage MOS power transistor structure, in the emitter switching configuration of the invention comprises:

an N+ type semiconductor substrate, an overlying semiconductor layer, a first P type region buried in the aforesaid layer, a second P type region connecting the first aforesaid region on the surface, the first and second region constituting the base region of the bipolar transistor, and a third N+ type region adjoining the aforesaid first region from below and constituting the emitter region of the bipolar transistor.

According to the invention, the semiconductor layer consists of a first N-type epitaxial layer and a second N-type epitaxial layer grown on it, the first region is located in the first epitaxial layer, in the vicintity of the surface adjacent to the second epitaxial layer, and the second region is located in the second epitaxial layer. The third region can consist of a completely buried layer located astride between the boundary of the first and second epitaxial layer, the body and source regions of the MOS can be located in the second epitaxial layer, in the vicinity of its surface and above the third region. The drain region of the MOS consists substantially of the region between the third region and the aforesaid body regions. Alternatively an integrated high-voltage bipolar power transistor and horizontal low-voltage MOS power transistor structure, in the emitter switching configuration comprises:

an N+ type semiconductor substrate, an N− type epitaxial layer grown on the substrate, a first P+ type region, constituting the base of the bipolar transistor, located in the layer in the vicinity of its surface, and a second N+ type region, constituting the emitter of the bipolar transistor, adjoining the aforesaid first region from below and from the side and adjoining the surface of the layer from above. According to the invention in the N− type epitaxial layer and in the vicinity of its surface there is a third P+ conductivity region as well as a fourth and a fifth N+ type region. These latter regions constutute the MOS source and gate regions respectively and being adjacent from below and from the side to the aforesaid third region. The metal coatings of the MOS transistor drain and of the bipolar transistor emitter are interconnected by means of tracks of conductor material.

A process for manufacturing an integrated high-voltage bipolar power transistor and vertical low-voltage MOS power transistor structure, in the emitter switching configuration is characterized by the fact that:

a second N conductivity epitaxial layer, designed to constitute the drain region of the MOS transistor and at the same time automatically form the connection between the drain of the MOS transistor and the emitter of the bipolar transistor, is grown on the first epitaxial layer, the body, the source and the gate of the MOS transistor are then created in the second epitaxial layer, by means of the known processes, in correspondence with the aforesaid buried emitter zone of the bipolar transistor, and a P+ type region, which enables the base region of the bipolar transistor to be electrically connected on the surface, is also created at the side of said MOS transistor, by means of the known techniques of oxidation, photomasking, implantation and diffusion.

Alternatively, the process is characterized in that:

a second P+ type region, separated from the first by a region of the epitaxial layer, is created in the epitaxial layer simultaneously to said first region, a fourth and a fifth N+ type region, designed to constitute the MOS source and drain region respectively, are created within the second region, and the deposition of tracks of conductor material designed to electrically interconnect the emitter and drain metal coatings is carried out simultaneously to the deposition of the films of conductor material designed to form the gate terminals and the metal coating which ensure the ohmic contact with the MOS source and drain regions and with the base and emitter regions of the bipolar transistor.

BRIEF DESCRIPTION OF THE DRAWING

The above and other objects, features and advantages of our invention will become more readily apparent from the following description, reference being made to the accompanying highly diagrammatic drawing in which.

SPECIFIC DESCRIPTION

Figure 1:
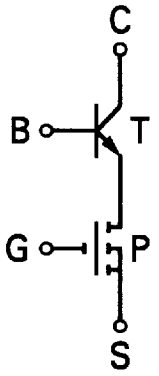
FIG. 1 is a circuit diagram which shows the equivalent electrical circuit of the 4-terminals integrated structures, which the invention intends to realize.

FIG. 1 shows the equivalent electrical circuit of the 4-terminal integrated structures that the invention intends to provide.

This circuit consists of a high-voltage bipolar power transistor T connected by means of its emitter to the drain of a low-voltage MOS power transistor P.

The various stages of the manufacturing process of the integrated structure, in the vertical MOS version, are described hereunder.

Figure 2:
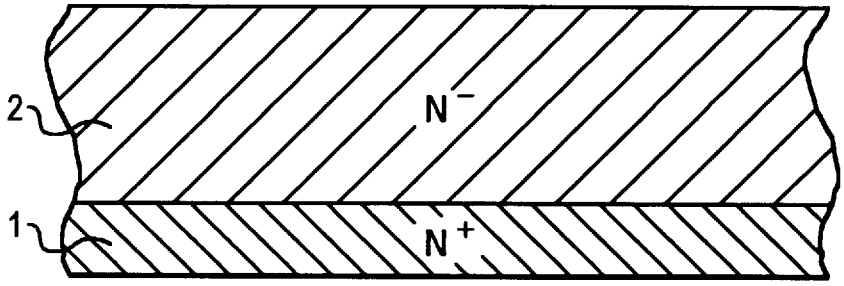
FIGS. 2–7 are diagrammatic sections which show a structure according to the invention, in the vertical MOS power transistor version, during the various stages of the manufacturing process.
Figure 3:
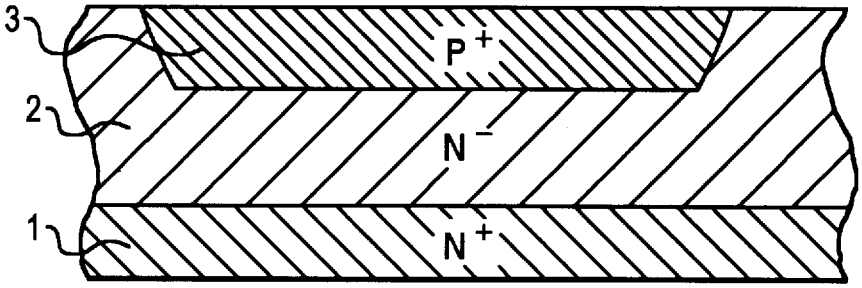
Figure 4:
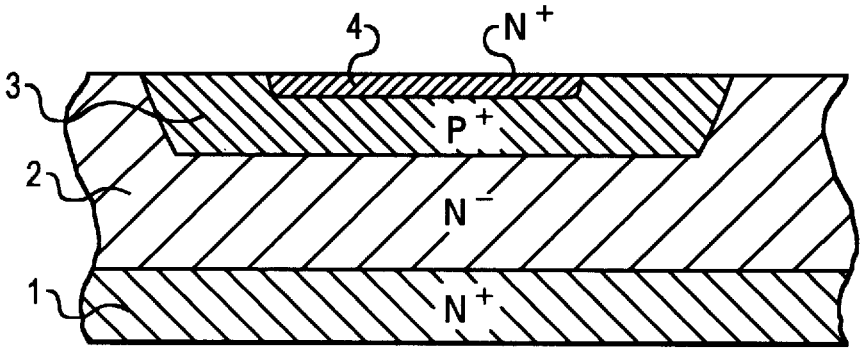
Figure 5:
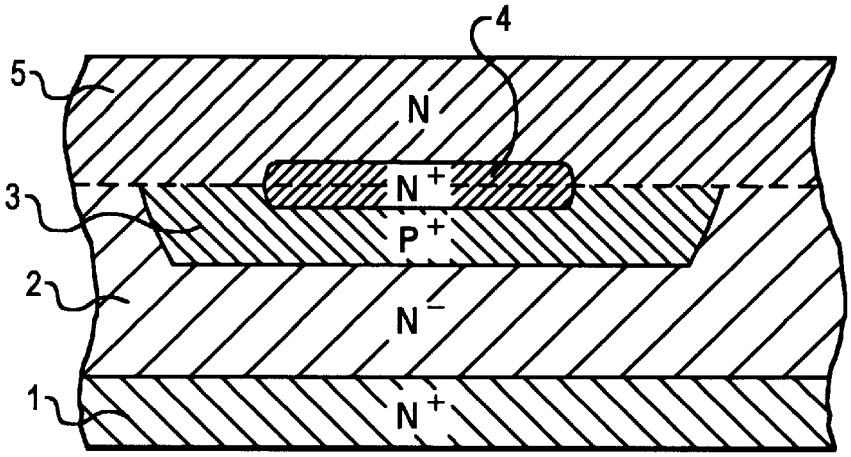
Figure 6:
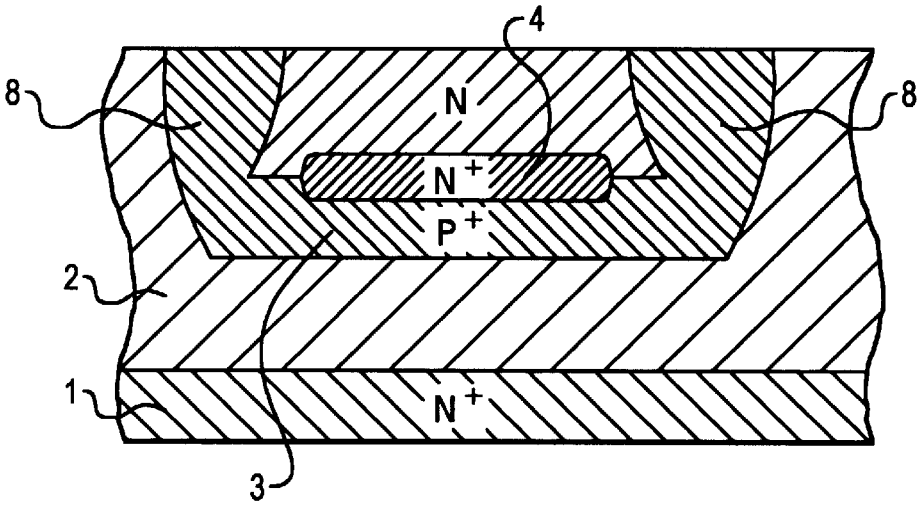

A first high resistivity N− conductivity epitaxial layer 2 is grown on an N+ type substrate 1 (FIG. 2). A P+ type region 3 is then obtained, by deposition or implantation and subsequent diffusion, on said layer 2 (FIG. 3). An N+ type region 4 is then obtained by means of the same process (FIG. 4). This is followed by the growth of a second N type epitaxial layer 5 (FIG. 5) and, by the known procedures of oxidation, photomasking, implantation and diffusion, the creation of the P+ type regions 8, which enable the region 3 constituting the base of the bipolar transistor to be connected on the surface (FIG. 6). A low-voltage vertical MOS power transistor and in particular the relative P conductivity body regions 6, N+ type source regions 7 (FIG. 7), the gate 9 and the metal coatings 10, 11 and 14 for ensuring the ohmic contact with the regions 6, 7, 8 and the substrate 1 (FIG. 8) are then created in the area between the two regions 8, according to known procedures.

Figure 8:
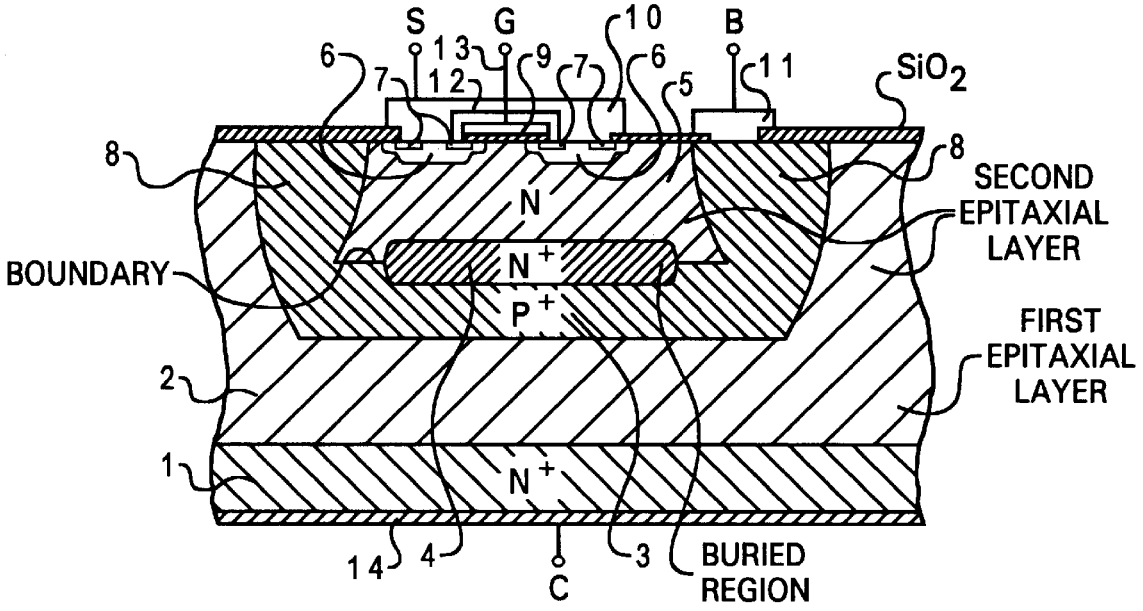
FIG. 8 is a section which shows the structure obtained at the end of the process referred to in the previous FIGS. 2–7.

FIG. 8 shows the final structure, as it appears after addition of the terminals C (collector). B (base), S (source) and G (gate) and the insulating layer 12 of the gate 9 (said gate being connected to the relative terminal by means of the insulated conductor 13). Regions 1, 2, 3 and 4 of the figure constitute, respectively, the collector, the base and the emitter of a bipolar transistor, while region 5 constitutes the drain of the MOS. Said drain is consequently connected directly to the emitter of the bipolar transistor thus forming a structure having as its equivalent circuit the circuit of FIG. 1.

Figure 7:
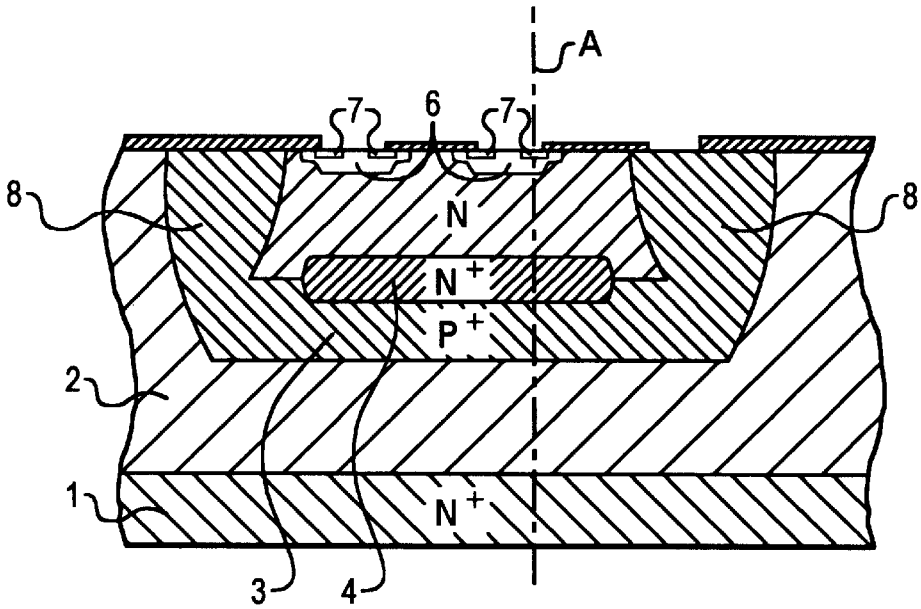
Figure 9:
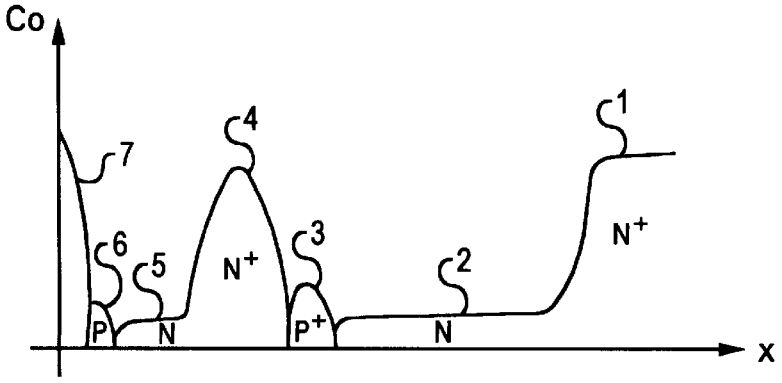
FIG. 9 is a diagram of the concentrations of the various types of doping agent along a section of the structure of FIG. 7.

The emitter 4 represents a completely buried N+ type active region; by growing a second N type epitaxial layer 5 it is thus possible to connect the drain of the MOS to the emitter 4 of the bipolar transistor, The profile of the concentration (Co) of the various types of doping agent in the different regions of the structure, along section A—A of FIG. 7, is shown in FIG. 9, where axis x refers to the distance from the upper surface of the structure.

The manufacturing process of the integrated structure, in the horizontal MOS power transistor version, includes the following stages.

Figure 10:
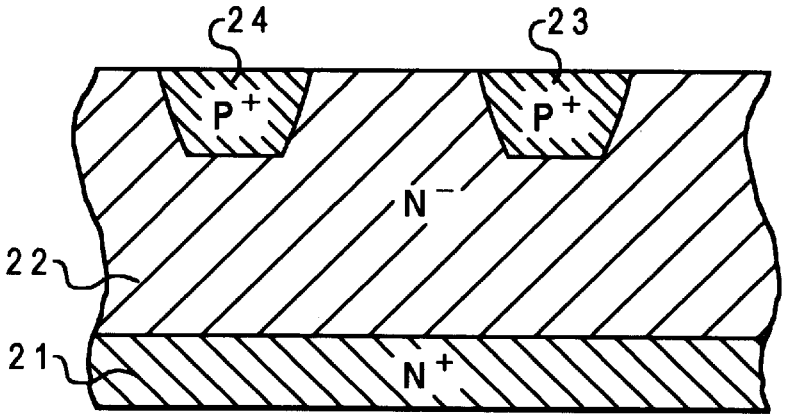
FIGS. 10–11 are sections which show a structure according to the invention, in the horizontal MOS power transistor version, during the various stages of the manfacturing process.

A high resistivity N− type epitaxial layer 22, which is designed to constitute the collector of the bipolar transistor, is grown on a N+ type substrate 21 (FIG. 10). Two P+ type regions 23 and 24 are then created simultaneously on said layer, by the known processes of deposition or implantation and subsequent diffusion, the first of which being destined to act as a base for the bipolar transistor and the second to receive the MOS.

Figure 11:
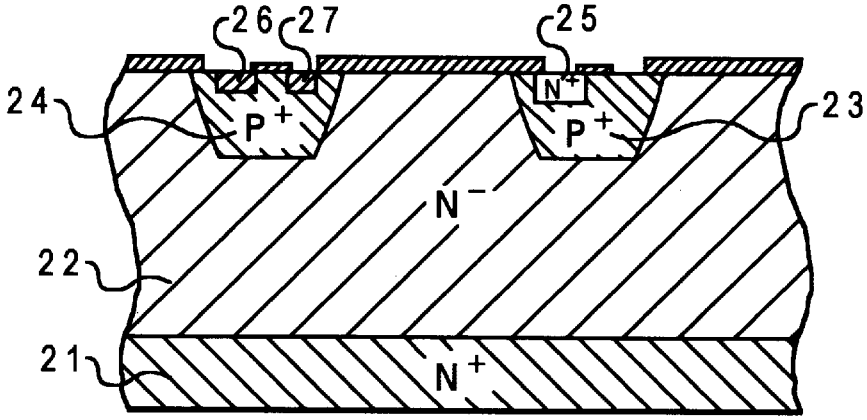
Figure 12:
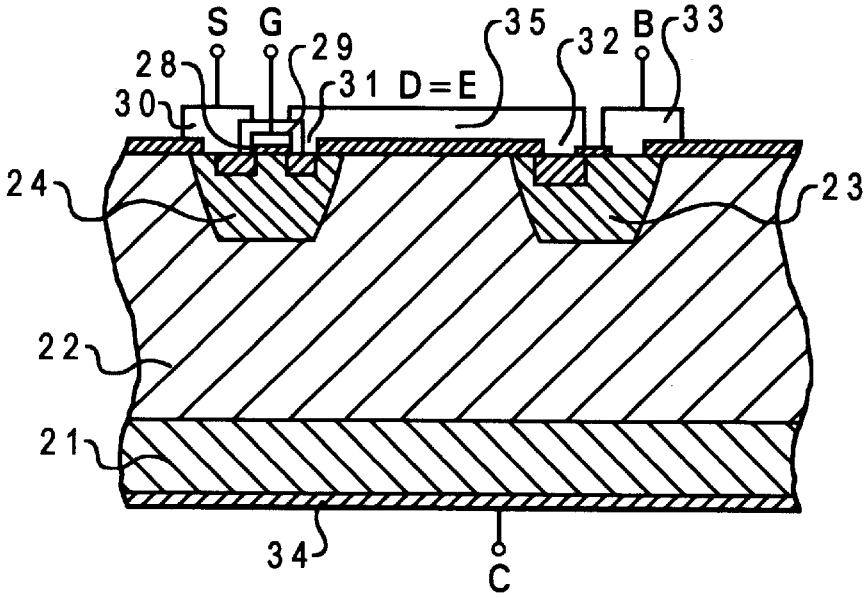
FIG. 12 is a section which shows a schematic representation of the structure obtained at the end of the process referred to in FIGS. 10–11.

By means of the known processes of oxidation, photomasking, deposition or implantation and subsequent diffusion, an N+ type region 25 which is destined to act as the emitter of the bipolar transistor is created within the region 23, while two N+ type regions 26 and 27 which are destined to act as the source and the drain of the MOS are created within the region 24 (FIG. 11). This is followed by the formation of the MOS gate 28, the gate insulating layer 29, the metal coatings 30, 31, 32, 33 and 34, which are designed to ensure the ohmic contact with the underlying regions, and lastly the connections to the terminals S, G, B and C (FIG. 12).

The aforesaid metal coatings also include the formation of a track 35 for connecting the drain D to the emitter E, so as to achieve the connection of the two transistors in the configuration of FIG. 1.

In both the vertical MOS and horizontal versions, the final structure obtained is provided with 4 terminals, 3 of said terminals being located on one face of the chip and the 4th on the other face.

The described process can obviously be used to simultaneously obtain, on the same chip, several pairs of bipolar and MOS transistors having a collector terminal in common and their base contacts, sources and gates connected to three respective common terminals by means of a metal coating carried out on the front of the chip at the end of the process.

We claim:

1. Process for manufacturing an integrated *structure comprising a* high-voltage bipolar power transistor and *a* vertical low-voltage MOS power transistor [structure], in [the] *an* emitter switching configuration, [of the type in which: a] *having an N− type* first [high resistivity N− type] epitaxial layer, designed to form [the] *a* collector of [the] *said* bipolar *power* transistor, [is] grown on [a] *an* N+ type substrate, a P+ conductivity region, designed to serve as [the] *a* base of [the] *said* bipolar *power* transistor, and [then] an N+ type region, designed to serve as [the] *a* buried emitter [zone] of [the same] *said bipolar power* transistor, [are subsequently] created on said first *epitaxial* layer, by deposition or [implanation] *implantation* and [subsequent] diffusion, [characterized by the fact that] *said process comprising*:

a second N conductivity epitaxial layer, designed to constitute [the] *a* drain [region] of [the] *said* MOS *power* transistor and [at the same time automaticaly] *automatically* form [the] *a* connection between [the] *said* drain of [the] *said* MOS *power* transistor and [the] *said buried* emitter of [the] *said* bipolar *power* transistor, is grown on [the] *said* first epitaxial layer, [the] *a* body, [the] *a* source and [the] *a* gate of [the] *said* MOS *power* transistor are [then] created in [the] *said* second epitaxial layer, in correspondence with [the aforesaid] *said* buried emitter [zone] of [the] *said* bipolar *power* transistor, a P+ type region, which enables [the] *electrical connection to be made to said* base [region] of [the] *said* bipolar *power* transistor [to be electrically connected on the surface], is [also] created at the side of [the] said MOS *power* transistor.

2. Process for manufacturing an integrated *structure comprising a* high-voltage bipolar power transistor and *a* horizontal low-voltage MOS power transistor [structure], in [the] *an* emitter switching configuration, [of the type in which: a high resistivity] *having an* N− type epitaxial layer, designed to form [the] *a* collector of [the] *said* bipolar *power* transistor, [is] grown on an N+ type substrate, a first P+ type region [is then created] in said epitaxial layer, a third N+ type region, designed to constitute [the] *an* emitter [region] of [the same] *said bipolar power* transistor, [is then created] *and* within [the aforesaid] *said* first *P+ type* region, *said first P+ type region being* designed to constitute [the] *a* base of [the] *said* bipolar *power* transistor,

*said process being* characterized by the fact that:

a second P+ type region, separated from [the] *said* first *P+ type region* by a region of [the] *said* epitaxial layer, is created in [the] *said* epitaxial layer simultaneously [to] *with* said first region, a fourth *N+ type region* and a fifth N+ type region, designed to constitute [the MOS] *a* source and *a* drain [region] respectively *of said MOS power transistor*, are created within [the] *said* second *P+ type* region, the deposition of tracks of conductor material designed to electrically interconnect [the] *said* emitter and *said* drain [metal coatings] *to each other* is carried out simultaneously [to] *with* the deposition of [the] films of conductor material designed to form [the] gate terminals and [the meatal] *metal* coatings which ensure the ohmic contact with [the MOS] *said* source and *said* drain [regions] *of said MOS power transistor* and with [the] *said* base and emitter [regions] of [the] *said* bipolar *power* transistor*;*

*wherein said MOS power transistor controllably cuts off current to said emitter of said bipolar power transistor, to provide high-voltage switching in a switched-emitter configuration having a primary current path between said fourth N+ type region and said N+ type substrate.*

*3. The method of claim 1, wherein said body of said MOS power transistor is formed before said source of said MOS power transistor.*

*4. The method of claim 1, wherein said body and said source of said MOS power transistor are both formed by implantation.*

*5. A process for manufacturing an integrated high-voltage bipolar power transistor and a vertical low-voltage MOS power transistor structure, comprising the steps of:*

*a) growing an N− type first epitaxial layer on an N+ type substrate, said first epitaxial layer providing a collector of said bipolar power transistor;*

*b) creating on said first epitaxial layer a P+ conductivity region providing a base of said bipolar power transistor, and an N+ the region providing a buried emitter zone, by deposition or implantation and diffusion;*

*c) growing an N conductivity second epitaxial layer on said first epitaxial layer, and forming a body region therein;*

*d) creating, at an upper surface of said second epitaxial layer, a source region and a gate of said MOS power transistor structure, in vertical correspondence with said buried emitter zone of said bipolar power transistor,*

*e) creating a P+ type region at the side of said MOS power transistor structure, which enables said base of said bipolar power transistor to be electrically connected on said upper surface.*

*6. The method of claim 5, wherein said second epitaxial layer is grown directly on said first epitaxial layer.*

*7. The method of claim 5, wherein said base is formed before said buried emitter zone.*

*8. The method of claim 5, wherein said body region is formed before said source.*

*9. The method of claim 5, wherein said body region and said source region are both formed by implantation.*

*10. The method of claim 5, wherein said gate is insulated on the underside thereof.*

*11. A process for manufacturing a structure having an integrated high-voltage bipolar power transistor and horizontal low-voltage MOS power transistor in an emitter switching configuration said process comprising the steps of:*

*growing an N− type epitaxial layer, designed to form a collector of said bipolar power transistor, on an N+ type substrate,*

*creating in said epitaxial layer,*

*a first P+ type region, to constitute a base of said bipolar power transistor, and*

*a second P+ type region separated from said first P+ type region by a region of said epitaxial layer;*

*creating a third N+ type region, to constitute an emitter region of said bipolar power transistor, within said first P+ type region;*

*creating a fourth and a fifth N+ type region, to constitute a source region and a drain region respectively, of said MOS power transistor within said second P+ type region,*

*forming a thin film of conductor material which is positioned and operatively connected to provide a field-effect-transistor-gate which controls conduction between said source region and said drain region of said MOS power transistor, and*

*forming a strip of thin film conductor material which is positioned and operatively connected to electrically interconnect said emitter region of said bipolar power transistor and said drain region of said MOS power transistor;*

*wherein said MOS power transistor controllably cuts off current to said emitter of said bipolar power transistor, to provide high-voltage switching in a switched-emitter configuration having a primary current path between said source region of said MOS power transistor and said collector of said bipolar power transistor.*

*12. The method of claim 11, wherein said field-effect-transistor-gate is insulated on the underside thereof.*

*13. A process for manufacturing a microelectronic structure which includes a vertical high-voltage bipolar power transistor, and which also includes a vertical low-voltage MOS power transistor structure extending to a front surface thereof, comprising the steps of:*

*a) on an N+ type substrate, growing an N− type first epitaxial layer, to provide the collector of the bipolar power transistor;*

*b) creating, near the front surface of said first epitaxial layer, a P+ region to provide a base of said bipolar power transistor, and an N+ type region, which is shallower than said P+ region, to provide an emitter of said bipolar power transistor;*

*c) growing an N+ type additional epitaxial layer above said first epitaxial layer;*

*d) forming, in said additional epitaxial layer, a P− type body region, and an N− type source region which is*

*shallower than said body region, and a P+ sinker region which provides ohmic contact to said base; and*

*e) creating, atop said additional epitaxial layer, an insulated gate electrode which is capacitively coupled to at least some potions of said body which are laterally adjacent to said source region.*

*14. The method of claim 13, wherein said additional epitaxial layer is grown directly on said first epitaxial layer.*

*15. The method of claim 13, wherein said base is formed before said emitter.*

*16. The method of claim 13, wherein said body region is formed before said source region.*

*17. The method of claim 13, wherein said body and source regions are both formed by implantation.*

*18. The method of claim 13, wherein said gate electrode is insulated on the underside thereof.*

*19. A process for manufacturing a solid-state structure which includes an integrated high-voltage bipolar power transistor, and which also includes a vertical low-voltage MOS power transistor, comprising the steps of:*

*a) providing a monolithic semiconductor structure which includes a first region which is doped with a dopant of a first conductivity type and a second region of said first conductivity type and is more lightly doped than said first region, and providing a metallic backside contact to said first region;*

*b) creating, in an upper surface of said monolithic semiconductor structure, a third region which is doped with a second conductivity type that is opposite to said first conductivity type, and a fourth region which is doped with said first conductivity type;*

*c) epitaxially growing an additional layer of semiconductor material of said first conductivity type above said monolithic semiconductor structure;*

*d) forming, in proximity to said front surface,*

*a body diffusion of said second conductivity type, and*

*a source diffusion of said first conductivity type that is completely separated by said body diffusion from other portions of said additional layer of semiconductor material, and*

*a diffusion region of said second conductivity type which extends upward from said third region;*

*e) creating, atop said additional layer of semiconductor material, an insulated gate electrode which is capacitively coupled to portions of said body diffusion which are laterally adjacent to said source diffusion.*

*20. The method of claim 19, wherein said body diffusion is formed before said source diffusion.*

*21. The method of claim 19, wherein said body and source diffusions are both formed by implantation.*

*22. The method of claim 19, wherein said gate electrode is insulated on the underside thereof.*

*23. The method of claim 19, wherein said additional layer is grown directly on said monolithic semiconductor structure.*

*24. The method of claim 19, wherein said first region of said monolithic semiconductor structure is a substrate, and said second region is an epitaxial layer grown on said substrate.*

*25. The method of claim 19, wherein said first conductivity type is N− type.*

* * * * *